United States Patent [19]
Wörthmann

[11] Patent Number: 5,622,303
[45] Date of Patent: Apr. 22, 1997

[54] METHOD AND DEVICE FOR SOLDERING WORKPIECES

[76] Inventor: Rainer Wörthmann, Mittelstrasse 6, 67134 Birkenheide, Germany

[21] Appl. No.: 429,715

[22] Filed: Apr. 27, 1995

[51] Int. Cl.$^6$ .............................. H05K 3/34; B23K 3/06
[52] U.S. Cl. .............................. 228/37; 228/260; 118/410
[58] Field of Search .............................. 228/180.1, 260, 228/37; 118/410

[56] References Cited

U.S. PATENT DOCUMENTS

| | | | |
|---|---|---|---|
| 3,039,185 | 6/1962 | Oates | 228/37 |
| 4,101,066 | 7/1978 | Corsaro et al. | 228/37 |
| 4,796,796 | 1/1989 | Habraken | 228/180.1 |

FOREIGN PATENT DOCUMENTS

| | | |
|---|---|---|
| 0206231A2 | 6/1986 | European Pat. Off. . |
| 380382A1 | 12/1990 | European Pat. Off. . |
| 3309839A1 | 10/1983 | Germany . |
| 62-9767 | 1/1987 | Japan ......... 228/37 |
| 1-228668 | 9/1989 | Japan ......... 228/37 |

Primary Examiner—P. Austin Bradley
Assistant Examiner—Jeffrey T. Knapp
Attorney, Agent, or Firm—Collard & Roe, P.C.

[57] ABSTRACT

The method and the device serve for soldering of workpieces, namely of pc boards and substrates, which are equipped with chip component parts and/or microelements and/or assemblies comprised thereof. Such boards are passed through a main solder bath or at least one main solder wave, and the workpiece is contacted with the surface of the wave. The solder wave has an imaginary break edge 2, i.e., a break edge at which the solder loses the contact with the workpiece in connection with an unwettable workpiece. The imaginary break edge 2 of the soldering device 1 extends not in a straight line and, viewed in the direction of conveyance 3, has at least one diminution 4, i.e., two edge parts ending in a point, i.e., the edges form a triangle.

4 Claims, 4 Drawing Sheets

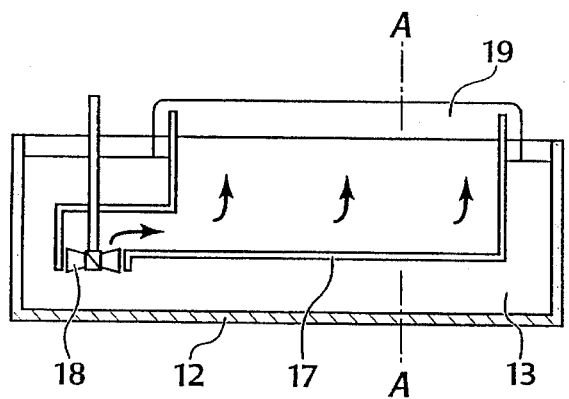
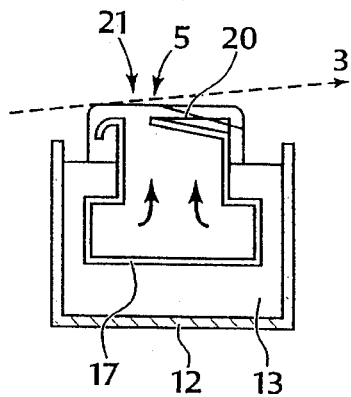
Fig. 9          Fig. 10
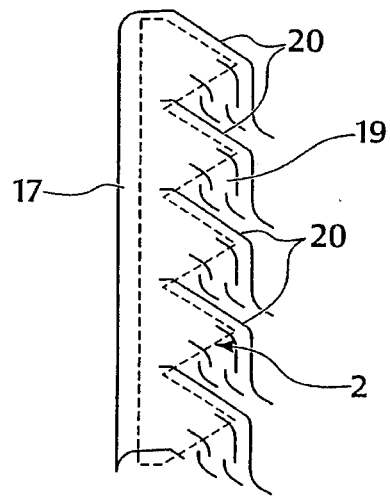
Fig. 11

METHOD AND DEVICE FOR SOLDERING WORKPIECES

The invention relates to a method for soldering workpieces, namely pc boards and substrates that are fitted with chip component parts and/or microelements and/or assemblies comprised thereof, with a main solder bath or at least one main solder wave, with whose surface the workpiece is contacted, and which has a break edge extending perpendicular to the direction of conveyance.

Furthermore, the invention relates to a device for carrying out the method, with a main solder bath or at least one solder wave, which is producible by means of a soldering nozzle, and which brings the undersides of the workpieces in contact with the solder transversely to the path of conveyance of the workpieces.

Solder baths or wave soldering installations are used for joining electric components with a carrier material, for example with a pc board or substrate. Chip components and microelements are increasingly used due to the progressing miniaturization of electronic circuits. From this results a constantly increasing connection density on the circuit boards, with very small pacings between the individual components and their connection surfaces. In addition, the formation of solder straps is promoted in the soldering process as well.

The known methods of bath or wave soldering use as the main or finished solder bath/solder wave a bath resting in the exit zone of the workpiece, or flowing in the direction of conveyance with a laminar flow. With all devices used in this connection, the workpiece is contacted by the solder over the entire width as it exits from the solder. Thus the devices have an imaginary break edge extending in a straight line perpendicular to the direction of conveyance. The imaginary break edge is understood to be the edge at which the solder, in connection with an unwettable workpiece, loses contact with the workpiece as the latter is being transported out of the solder bath. Due to the capillary or adhesive effect of the support points of the solder, and also due to the surface tension of the liquid solder, the latter is displaced by the circuit board beyond the imaginary break edge, in the direction of the maximum break edge. The maximum break edge is understood to be the edge at which the solder, in connection with a completely wettable workpiece, loses contact with the latter as it is being transported out of the solder bath. The complete break of the solder wave now takes place at any point between the imaginary break edge and the maximum break edge depending on the construction and arrangement of the components on the workpiece.

Particularly with a close arrangement of components and component connections on the workpiece, an amount of solder is dragged by the component across the imaginary break edge, and a connection is formed between the solder accumulation and the solder bath. Due to the high surface tension of the liquid solder, the connection undergoes a diminution in the center, which also represents the weakest point of the connection. As the workpiece is being transported further, the connection will break at said point, and the solder still present on the workpiece remains on the latter as a solder strap. Such dragging of solder occurs particularly when several points of support of the solder are disposed in one row parallel with the break edge and the wetting forces of the individual points of support of the solder add up.

The invention is based on the problem of proposing a method and a device that make it possible to solder even closely equipped circuit boards and substrates free of solder straps.

According to the proposed method, said problem is solved in that the break edge of the main solder bath or main solder wave—at which edge the solder loses in connection with an unwettable workpiece the contact with the latter (imaginary break edge)—is formed not straight-lined and at least in parts not perpendicular to the direction of conveyance of the workpiece.

An advantageous process step consists in that the imaginary break edge has in the direction of conveyance of the workpiece a triangular, round, semiround, oval or the like shape.

An advantageous device for carrying out the method consists in that the solder surface produced in connection with the main or finished solder bath/solder wave by the soldering nozzle in the exit zone of the workpiece has at least one diminution in the direction of conveyance.

According to an advantageous embodiment, provision is made that the soldering nozzle is fitted with bores arranged in a triangular form, whereby the points of the triangle point in the direction of conveyance.

Furthermore, it is advantageous that the bore pattern of the bores in the round, semiround or oval form is arranged pointing in the direction of conveyance.

It is proposed, furthermore, that the soldering nozzle has within the exit zone toward the workpiece baffle plates for producing the diminutions in the direction of conveyance.

Finally, provision is made that an additional soldering nozzle with an additional pump aggregate is arranged within the soldering nozzle, said additional soldering nozzle producing for the main solder wave produced by a laminar flow of the solder bath an additional solder wave with diminutions in the direction of conveyance.

According to the invention, provision is thus made that through one or several diminutions of the solder surface in the exit zone of the workpiece in the direction of conveyance in connection with the main or finished solder bath/solder wave, the surface tension of the liquid solder forces the return of the solder from adjacent points of support of the solder into the main solder bath without breaking the mechanical connection with the workpiece, such connection making the return of the solder possible. It is particularly advantageous in this connection if several adjacent elements are present spaced apart in one row and substantially perpendicular to the direction of conveyance, such elements permitting such a return of the solder from the workpiece. Hence the result is that the imaginary break edge does not extend in a straight line and perpendicular to the direction of conveyance, but not in a straight line and at least in parts not perpendicular to the direction of conveyance.

The invention is explained in greater detail in the following description by reference to the exemplified embodiments shown in the drawings, in which:

FIG. 9 shows a section through a soldering device according to an embodiment according to the invention;

FIG. 10 shows a section according to line A—A in FIG. 9;

FIG. 11 is a perspective view of FIG. 10;

Figures 1, 2:
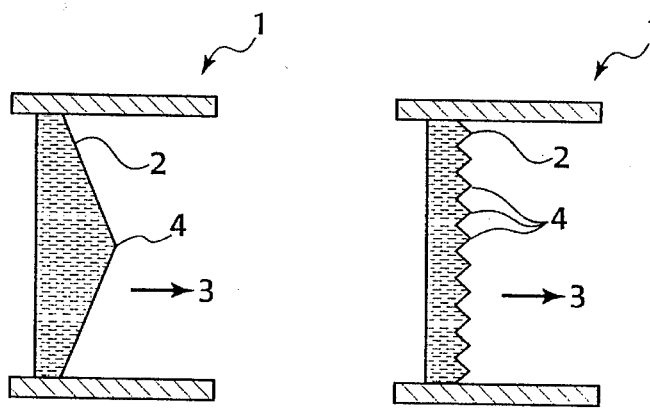
FIG. 1 is a top view of the soldering nozzle shown schematically with the imaginary break edge produced, according to a first embodiment.
FIG. 2 is a corresponding representation of the soldering nozzle with the imaginary break edge according to another embodiment.

In the embodiment shown in FIG. 1, the reference numeral 1 schematically denotes the soldering nozzle, whereby the imaginary break edge 2 is shown in the direction of conveyance 3, said edge tapering to a point with respect to the workpiece. Said imaginary break edge 2 means an edge at which the solder loses in connection with an unwettable workpiece the contact with the latter when it is moved across the solder bath/solder wave. Said break edge 2 has a diminution 4. The meaning of this measure is that the surface tension of the liquid solder forces in this way the return of the solder from adjacent points of support of the solder into the main solder bath without breaking the mechanical connection with the workpiece, such connection permitting the return of the solder.

Said effect can be considerably enhanced if the formation of an imaginary break edge 2 is realized according to FIG. 2 by arranging a number of adjacent diminutions 4 spaced apart in one row, substantially perpendicular to the direction of conveyance 3.

The result thereof is that the imaginary break edge 2 does not extend in a straight line perpendicular to the direction of conveyance 3 but on account of the design of the nozzle of the soldering nozzle not in a straight line and at least in part not perpendicular to the direction of conveyance 3.

Figures 3, 4, 5:
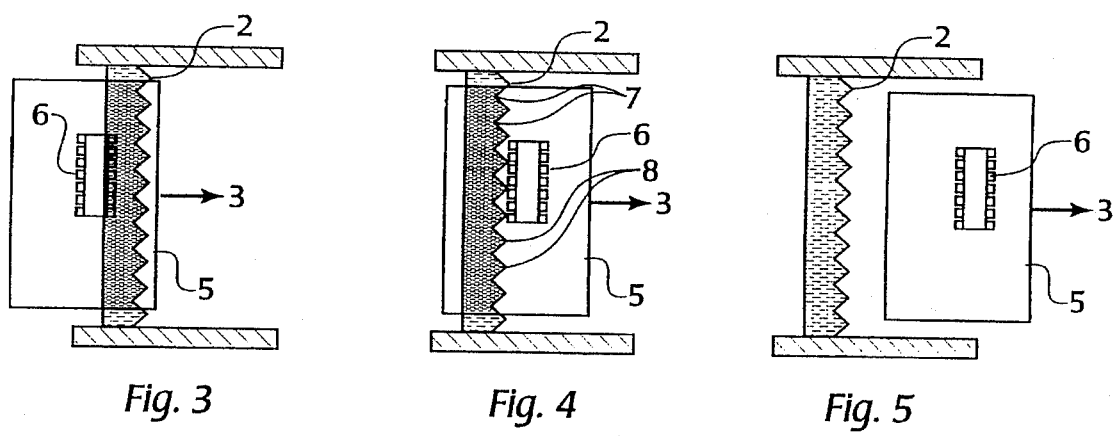
FIGS. 3 to 5 show the passage of a workpiece through such a soldering nozzle with the imaginary break edge according to FIG. 2.

FIGS. 3 to 5 show the effect of the design of a soldering nozzle according to FIG. 2 with respect to a workpiece 5 to be soldered, with the chip components or micro-elements 6 to be soldered on said workpiece. In this connection, the workpiece 5 is first wetted (FIG. 3), whereby the support points 7 of the solder may be bridged by the solder across large areas. When the workpiece 5 approaches the imaginary break edge 2, the surface tension of the liquid solder causes the solder to flow from the solder support points 7, which have already crossed over the imaginary break edge 2, to the solder support points 8, which still have contact with the solder (FIG. 4). No accumulation of solder occurs in this connection at the solder support points 8, and therefore only a minor displacement of solder occurs beyond the imaginary break edge 2. This results in a solder strap-free soldering even with a close arrangement of the components and connections (FIG. 5).

The formation of the imaginary break edge 2 is not limited to the triangular form described above. Round, semi-round, oval and other shapes resulting in such a configuration of the imaginary break edge 2 are possible as well. The break edge 2 is produced in this connection by a corresponding structure of the solder bath of the solder wave, by the modulation of the surface of the solder by an energy additionally introduced in the solder bath, or in some other way.

Figures 6, 7, 8:
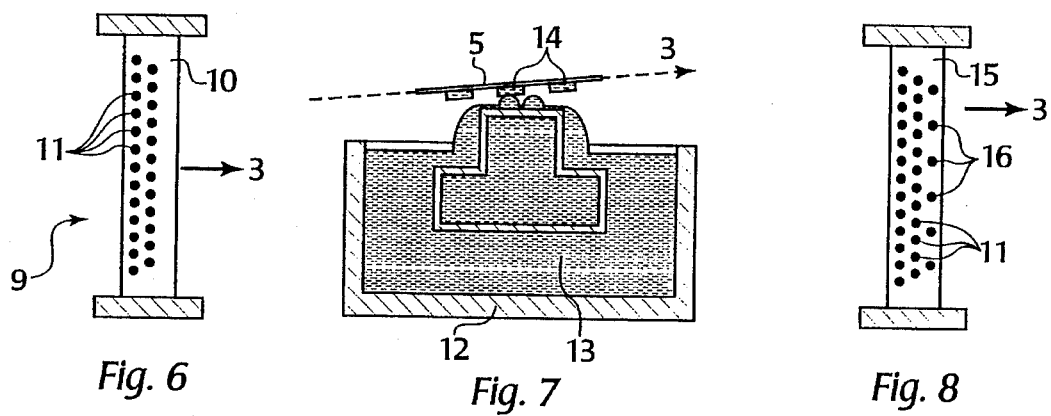
FIG. 6 shows a top view of the design of a soldering nozzle in connection with a presolder bath.
FIG. 7 is a sectional view of such a soldering device.
FIG. 8 shows a top view of such a soldering nozzle according to the invention, for solder strap-free soldering.

FIGS. 6 to 8 show an embodiment for the realization of the invention. With this embodiment, provision is made for a pre- or chip solder bath/solder wave 9 with a soldering nozzle 10, in which the bores 11 are arranged one or displaced in several rows perpendicular to the direction of conveyance 3. The soldering nozzle 10 is disposed in a container 12, which is filled with the solder melt 13. Said pre-solder bath has the function of obtaining a complete wetting of all components shortly before the workpiece enters the main solder bath/main solder wave. By means of a pump, the solder is conducted under slight pressure through the bores 11 and against the underside of the workpieces 5. The characteristic pinheads 14 of the solder produced in this way expel air or flux inclusions from the underside of the workpiece (FIG. 7). The high kinetic energy also effects a rapid breaking of the solder from the workpiece 5 without returning displaced solder. This means that a great number of solder straps are produced on the workpiece 5. An arrangement according to FIG. 8 permits a solder strap-free soldering and thus satisfies the requirements with respect to both a presolder wave and a main solder wave. It is, therefore, not necessary to arrange an additional main solder wave downstream. Viewed at their front sides in the direction of conveyance 3, the bores 11 form a triangular configuration with the triangle points 16, so that the shape of the imaginary break edge 2 is maintained in this way as explained in FIGS. 2 to 5. Thus a solder strap-free soldering is accomplished.

A specially designed soldering nozzle 17 is arranged in the container 12 with the solder melt 13, whereby the solder is conveyed to the nozzle opening 21 with the help of a pump aggregate 18, and a solder wave 19 is produced there. The installing the suitable baffle plates 20 within the zone of the outlet opening 21, a configuration of the solder wave 19 is obtained as shown by the broken lines in FIG. 11, whereby the imaginary break edge 2 is produced.

Figure 12:
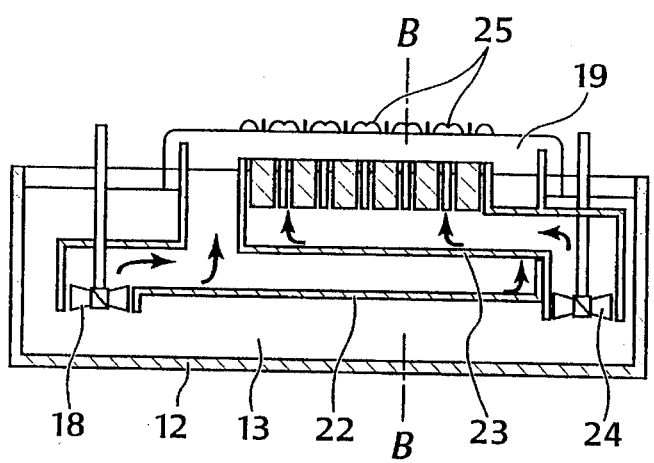
FIG. 12 shows a section through a soldering device according to another embodiment according to the invention.
Figure 13:
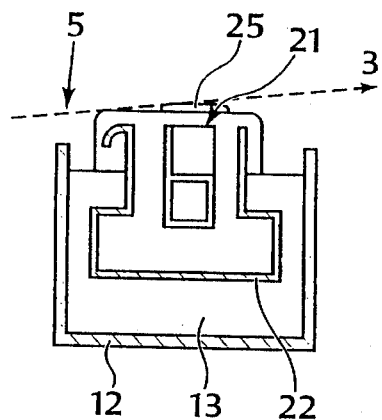
FIG. 13 shows a section according to line B—B in FIG. 12.
Figure 14:
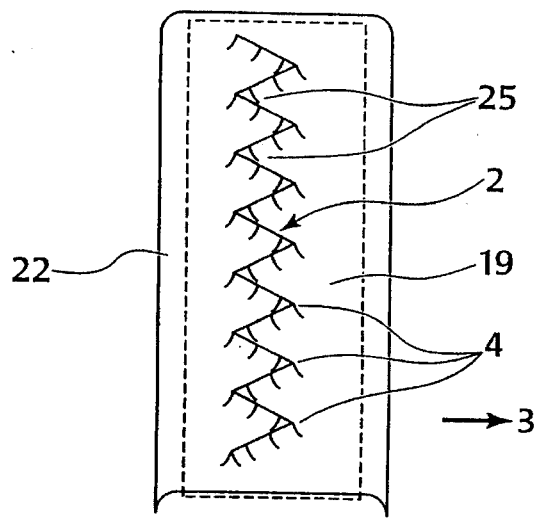
FIG. 14 is a perspective view of FIG. 13.

FIGS. 12 to 14 show another embodiment for producing such a break edge 2, whereby an additional solder nozzle 23 with an additional pump aggregate 24 is arranged within a soldering nozzle 22, where the pump aggregate 18 produces a solder bath with a laminar flow. The outlet opening of said additional solder nozzle 23 is designed in such a way that an additional solder wave 25 with the diminutions 4 in the direction of conveyance 3 is produced. In this connection, dome-like elevations are obtained on the main solder wave 19 in accordance with said additional solder wave 25.

Figure 15:
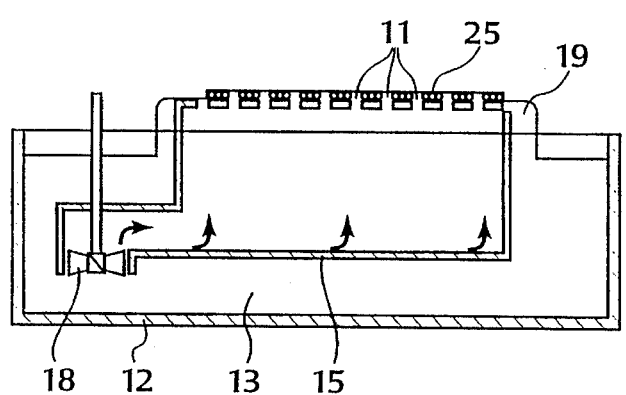
FIG. 15 shows a section through a soldering device according to another embodiment according to the invention.
Figure 16:
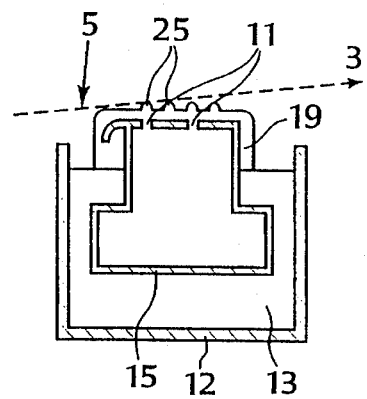
FIG. 16 shows a section according to line C—C in FIG. 15.
Figure 17:
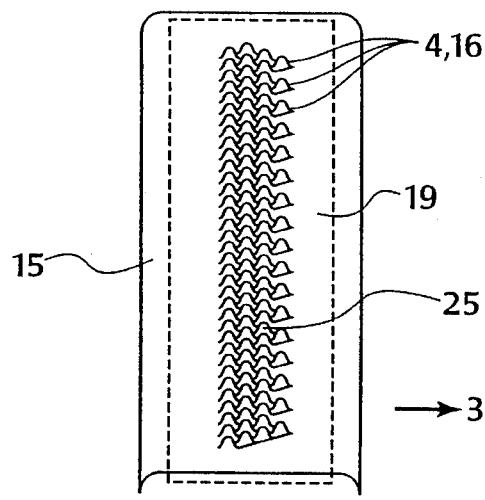
FIG. 17 shows a perspective view of the arrangement according to FIG. 16.

FIGS. 15 to 17 illustrate the exemplified embodiment schematically shown in FIG. 8. An additional solder wave 25 is produced in accordance with the bores 11, such bores effecting the diminutions 4 of the surface of the solder. Thus the triangular or zigzag-shaped configuration of the imaginary break edge is obtained.

I claim:

1. A device for soldering circuit boards having electrical components mounted on the top side of said boards, comprising:

at least one soldering nozzle;

a plurality of bores arranged on each soldering nozzle;

means for conveying liquid solder through said nozzle bores so as to create a solder wave directed onto the underside of said circuit board, said solder wave having a break edge that is created when the liquid solder breaks connection with the workpiece; and means for conveying the workpiece along a path such that the solder wave contacts the underside of the workpiece perpendicular to the path of conveyance, said bores being arranged in a pattern comprised of a plurality of triangles on each soldering nozzle, wherein the triangle points are directed in the direction of conveyance of the workpiece, so that the break edge on said solder wave follows the shape of the bore pattern.

2. The device according to claim 1 wherein there are two soldering nozzles, and wherein the means for conveying the solder through said nozzle bores is a pump that conducts liquid solder through said bores.

3. A device for soldering circuit boards having electrical components mounted on the top side of said boards, comprising:

at least one soldering nozzle;

a plurality of bores arranged on each soldering nozzle;

means for conveying liquid solder through said nozzle bores so as to create a solder wave directed onto the underside of said circuit board, said solder wave having a break edge that is created when the liquid solder breaks connection with the workpiece; and means for conveying the workpiece along a path such that the solder wave contacts the underside of the workpiece perpendicular to the path of conveyance, said bores being arranged in a pattern of repeating shapes selected from the group consisting of round, semi-round and oval, the edges of such shapes pointing in the direction of conveyance of the workpiece, so that the break edge on said solder wave follows the shape of the bore pattern.

4. The device according to claim 3 wherein there are two soldering nozzles, and wherein the means for conveying the solder through said nozzle bores is a pump that conducts molten solder through said bores.

\* \* \* \* \*